United States Patent
Ohno et al.

(10) Patent No.: US 7,189,684 B2
(45) Date of Patent: Mar. 13, 2007

(54) POLISHING COMPOSITION AND METHOD FOR FORMING WIRING STRUCTURE USING THE SAME

(75) Inventors: Koji Ohno, Gifu-ken (JP); Chiyo Horikawa, Gifu-ken (JP); Kenji Sakai, Aichi-ken (JP); Kazusei Tamai, Aichi-ken (JP); Katsuyoshi Ina, Aichi-ken (JP)

(73) Assignee: Fujimi Incorporated, Aichi (JP)

( * ) Notice: Subject to any disclaimer, the term of this patent is extended or adjusted under 35 U.S.C. 154(b) by 428 days.

(21) Appl. No.: 10/476,717

(22) PCT Filed: Mar. 4, 2003

(86) PCT No.: PCT/JP03/02490

§ 371 (c)(1),
(2), (4) Date: May 5, 2004

(87) PCT Pub. No.: WO03/075332

PCT Pub. Date: Dec. 9, 2003

(65) Prior Publication Data

US 2004/0192049 A1      Sep. 30, 2004

(30) Foreign Application Priority Data

Mar. 4, 2002  (JP) ............................. 2002-057497
Oct. 1, 2002  (JP) ............................. 2002-289201

(51) Int. Cl.
*C09K 13/00* (2006.01)

(52) U.S. Cl. ................... 510/175; 252/79.1; 438/692

(58) Field of Classification Search ................ None
See application file for complete search history.

(56) References Cited

U.S. PATENT DOCUMENTS 5,527,423 A   6/1996   Neville et al. ........... 156/636.1

(Continued)

FOREIGN PATENT DOCUMENTS

EP         1029907 A1     8/2000

(Continued)

OTHER PUBLICATIONS

U.S. Appl. No. 08/982,933.

*Primary Examiner*—Gregory Webb
(74) *Attorney, Agent, or Firm*—Vidas, Arrett & Steinkraus PA

(57) ABSTRACT

A polishing composition capable of satisfactorily polishing a semiconductor. The first polishing composition of the present invention includes silicon dioxide, at least one component selected from periodic acids and salts thereof, at least one component selected from tetraalkyl ammonium hydroxides and tetraalkyl ammonium chlorides, hydrochloric acid, and water, and contains substantially no iron. The second polishing composition of the present invention includes a predetermined amount of fumed silica, a predetermined amount of at least one component selected from periodic acids and salts thereof, a tetraalkyl ammonium salt represented by the following general formula (1), at least one component selected from ethylene glycol and propylene glycol, and water. The pH of the second polishing composition is greater than or equal to 1.8 and is less than 4.0.

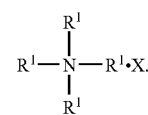

(1)

18 Claims, 1 Drawing Sheet

U.S. PATENT DOCUMENTS

| | | | |
|---|---|---|---|
| 5,575,837 A | 11/1996 | Kodama et al. | 106/3 |
| 5,958,288 A * | 9/1999 | Mueller et al. | 252/186.1 |
| 5,980,775 A * | 11/1999 | Grumbine et al. | 252/79.1 |
| 6,001,269 A | 12/1999 | Sethuraman et al. | 216/89 |
| 6,015,506 A * | 1/2000 | Streinz et al. | 252/186.1 |
| 6,083,419 A | 7/2000 | Grumbine et al. | 252/79.1 |
| 6,117,783 A | 9/2000 | Small et al. | 438/693 |
| 6,136,711 A | 10/2000 | Grumbine et al. | 438/692 |
| 6,277,015 B1 | 8/2001 | Robinson et al. | 451/528 |
| 6,290,736 B1 | 9/2001 | Evans | 51/307 |
| 6,313,039 B1 * | 11/2001 | Small et al. | 438/693 |
| 6,328,774 B1 * | 12/2001 | Shemo et al. | 51/307 |
| 6,332,831 B1 * | 12/2001 | Shemo et al. | 451/41 |
| 6,635,186 B1 * | 10/2003 | Small et al. | 216/88 |
| 2003/0084815 A1 | 5/2003 | Ohno et al. | 106/3 |

FOREIGN PATENT DOCUMENTS

| | | |
|---|---|---|
| JP | 10-265766 | 6/1998 |
| JP | 2000-501771 | 2/2000 |
| JP | 2000-340532 | 12/2000 |
| JP | 2001-144045 | 5/2001 |
| JP | 2001-144051 | 5/2001 |
| WO | 98/04646 | 2/1998 |
| WO | WO 00/24842 | 5/2000 |

* cited by examiner

POLISHING COMPOSITION AND METHOD FOR FORMING WIRING STRUCTURE USING THE SAME

FIELD OF THE INVENTION

The present invention relates to a polishing composition for use in formation of a wiring structure in, for example, a semiconductor device, and a method for forming a wiring structure using the polishing composition.

BACKGROUND OF THE INVENTION

A polishing composition for use in formation of a wiring structure in a semiconductor device is required to have a high capability for polishing a conductive metal such as tungsten and have a low capability for polishing an insulator such as silicon dioxide. This is intended for inhibiting the occurrence of erosion on the surface of the semiconductor device.

For forming the wiring structure, a conductor layer 13 composed of a conductive metal is generally formed on an insulator layer 11 having trenches 12 on the surface (see FIG. 1). Thereafter, the conductor layer 13 is polished so that the insulator layer 11 in areas other than trenches 12 is exposed (see FIG. 3). Erosion refers to a phenomenon in which as shown in FIG. 4, the insulator layer 11 between neighboring trenches 12 in an area where trenches 12 are densely formed is excessively polished, whereby the surface of the insulator layer 11 in the area is recessed in the direction of thickness of the insulator layer 11 as compared to the surface of the insulator layer 11 in other areas. The degree of recess of the surface of the insulator layer 11 at this time is represented by erosion amount e (see FIG. 4). The erosion increases wiring resistance of the semiconductor device and reduces flatness thereof.

Japanese Laid-Open Patent Publication No. 10-265766 discloses a first conventional polishing composition containing hydrogen peroxide and iron nitrate. The first conventional polishing composition has a high capability for polishing tungsten owing to a synergistic effect of hydrogen peroxide and iron nitrate. However, iron ions originating from iron nitrate may remain in a semiconductor device polished with the first conventional polishing composition. The remaining iron ions cause surface defects to occur in the semiconductor device and degrade electrical characteristics of the semiconductor device.

On the other hand, Japanese National Phase Laid-Open Patent Publication No. 2000-501771 discloses a second conventional polishing composition containing ammonium persulfate and potassium periodate. The second conventional polishing composition has a high capability for polishing tungsten owing to a synergistic effect of ammonium persulfate and potassium periodate. However, it also has a high capability for polishing silicon dioxide. Therefore, the second conventional polishing composition does not inhibit erosion.

SUMMARY OF THE INVENTION

An object of the present invention is to provide a polishing composition capable of satisfactorily polishing a semiconductor device.

For achieving the object described above, in one aspect of the present invention, the following polishing composition is provided. The polishing composition includes silicon dioxide, at least one component selected from periodic acids and salts thereof, at least one component selected from tetraalkyl ammonium hydroxides and tetraalkyl ammonium chlorides, hydrochloric acid, and water, and contains substantially no iron.

In another aspect of the present invention, the following polishing composition is provided. The polishing composition includes fumed silica at a content of greater than 20 g and less than or equal to 200 g per liter of the polishing composition; at least one component selected from periodic acglycol; and water. The pH of the polishing composition is greater than or equal to 1.8 and is less than 4.0. In the general formula (1), $R^1$ represents a hydrocarbon group having 1 to 4 carbon atoms, and X represents a hydroxy group or a halogen atom:

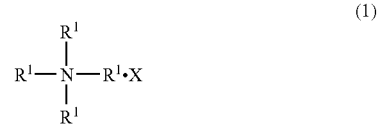

Other aspects and advantages of the present invention will be apparent from the following description with the drawings showing examples embodying the principles of the present invention.

DETAILED DESCRIPTION OF THE PREFERRED EMBODIMENTS

Figure 1:
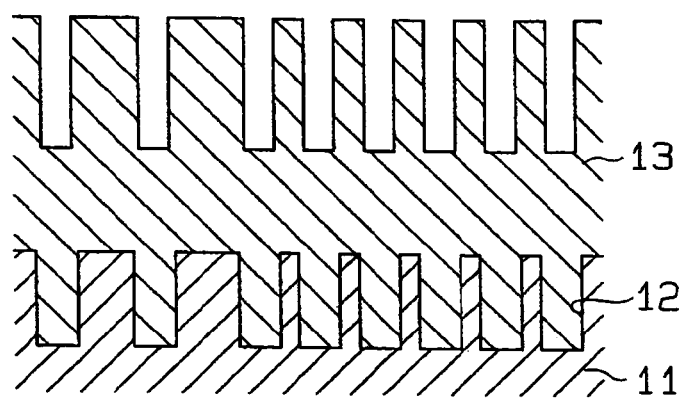
FIGS. 1 and 2 are fragmentary cross-sectional views each showing a semiconductor device in which the wiring structure is being formed using a polishing composition according to first and second embodiments of the present invention.

A first embodiment of the present invention will be described below.

A polishing composition according to the first embodiment is comprised of silicon dioxide as component A, at least one component selected from periodic acids and salts thereof as component B, at least one component selected from tetraalkyl ammonium hydroxides and tetraalkyl ammonium chlorides as component C, hydrochloric acid as component D, and water as component E.

First, silicon dioxide as component A will be described.

Specific examples of silicon dioxide include colloidal silica, fumed silica and precipitation silica. Preferable silicon dioxide is fumed silica. Fumed silica is generally produced by subjecting silicon tetrachloride to gas phase hydrolysis in an oxyhydrogen flame. Fumed silica produced in this way has a chain structure with several to several tens of particles three-dimentionally agglomerated. In addition, fumed silica is characterized in that the content of metal impurities is low.

The average particle size of silicon dioxide calculated from a BET specific surface area and a particle density is preferably 10 nm or greater, more preferably 20 nm or greater. Furthermore, the average particle size is preferably 50 nm or less, more preferably 40 nm or less. Hereinafter, the average particle size calculated from the BET specific surface area and the particle density is referred to as an average particle size D1. The BET specific surface area is measured using, for example, Flow Sorb II 2300 manufactured by Micromeritics Co., Ltd.

The average particle size of silicon dioxide measured by a light-scattering method is preferably 80 nm or greater, more preferably 100 nm or greater. Furthermore, the average particle size is preferably 250 nm or less, more preferably 200 nm or less. Hereinafter, the average particle size measured by the light-scattering method is referred to as an average particle size D2. The average particle size D2 is measured using, for example, N4 Plus Submicron Particle Sizer manufactured by Beckman Coulter, Inc.

The content of silicon dioxide in the polishing composition according to the first embodiment is preferably 20 g/liter or greater, more preferably 50 g/liter or greater. Furthermore, the content is preferably 200 g/liter or less, more preferably 150 g/liter or less.

Periodic acids and salts thereof as component B will now be described.

Specific examples of periodic acids include ortho-periodic acid ($H_5IO_6$), meta-periodic acid ($HIO_4$), bimeso-periodic acid ($H_4I_2O_9$), meso-periodic acid ($H_3IO_5$) and biorthoperiodic acid ($H_6I_2O_{11}$). A preferable periodic acid is ortho-periodic acid. This is because ortho-periodic acid is stable in composition and can easily be obtained. Specific examples of periodates include various salts of the periodic acids described above. Preferable periodates are ammonium periodate, potassium periodate and sodium periodate.

The content of component B in the polishing composition according to the first embodiment is preferably 5 g/liter or greater, more preferably 10 g/liter or greater. Furthermore, the content is preferably 50 g/liter or less, more preferably 30 g/liter or less.

Tetraalkyl ammonium hydroxides and tetraalkyl ammonium chlorides as component C will now be described.

Alkyl groups of tetraalkyl ammonium hydroxides and tetraalkyl ammonium chlorides are not specifically limited, but a methyl group or ethyl group is preferable.

The content of component C in the polishing composition according to the first embodiment is preferably a content allowing the polishing composition to be kept at pH of 2 to 3, more preferably 2.1 to 2.8.

Hydrochloric acid as component D will now be described.

The mass fraction of hydrochloric acid in the polishing composition according to the first embodiment is preferably 10 ppm or greater, more preferably 30 ppm or greater. Furthermore, the mass fraction is preferably 1000 ppm or less, more preferably 200 ppm or less. The mass fraction, i.e. concentration, of hydrochloric acid is converted from the concentration of chlorine measured by ion chromatography. As in the case where component A is fumed silica, components other than component D contained in the polishing composition according to the first embodiment may contain hydrochloric acid as an impurity. In this case, if the amount of hydrochloric acid contained as an impurity is already a desired amount, it is not necessary to newly add hydrochloric acid to the polishing composition according to the first embodiment.

Finally, water as component E will be described.

Water serves as a dispersion medium and solvent for components other than water contained in the polishing composition according to the first embodiment. Preferably, as much as possible, the water contains no impurities. Preferable water is pure water, extrapure water and distilled water.

The components A to E described above are mixed together to prepare the polishing composition according to the first embodiment. The pH of the polishing composition according to the first embodiment is preferably 2 or greater, more preferably 2.1 or greater. Furthermore, the pH is preferably 3 or less, more preferably 2.8 or less.

Preferably, as much as possible, the polishing composition according to the first embodiment contains no impurities. Specifically, the mass fractions of elements of the second to twelfth groups of the periodic table, aluminum, gallium, indium, thallium, tin, lead and bismuth are each preferably 100 ppb or less, more preferably 50 ppb or less. Copper, iron, nickel, chromium and manganese are particularly easily diffused into an insulator layer 11 of the semiconductor device (see FIGS. 1 to 3), thus causing a reduction in yield of the semiconductor device. Therefore, it is preferable that the mass fractions of particularly copper, iron, nickel, chromium and manganese are each within the above described range.

Expression of the number of a group of an element is based on revised IUPAC Inorganic Chemistry Nomenclature (1989). The mass fractions, i.e. concentrations, of elements of the second to twelfth groups of the periodic table, aluminum, gallium, indium, thallium, tin, lead and bismuth are measured using, for example, an inductively coupled plasma-mass spectroscope (ICP-MS), inductively coupled radio frequency plasma spectroscope (ICP-AES), atomic adsorption spectrometer or Total Reflection X-ray Fluorescence analysis apparatus (TXRF).

A method for forming a wiring structure of a semiconductor device using the polishing composition according to the first embodiment will now be described based on FIGS. 1 to 3. The method comprises a first step of forming a conductor layer 13 on an insulator layer 11 having trenches 12 on the surface (see FIG. 1), a second step of polishing the conductor layer 13 to remove most parts of the conductor layer 13 outside the trenches 12 (see FIG. 2), and a third step of forming wiring portions 14 composed of the conductor layer 13 in trenches 12 by polishing the conductor layer 13 so that the insulator layer 11 in areas other than trenches 12 is exposed (see FIG. 3).

As shown in FIG. 1, in the first step, trenches 12 having predetermined patterns, i.e. grooves, based on a circuit design are first formed on the surface of the insulator layer 11 on a semiconductor substrate (not shown). Formation of trenches 12 is performed according to a well known lithographic technique and etching technique. Specific examples of the insulator layer 11 include $SiO_2$ films such as a TEOS film, a BSG film, a PSG film and a BPSG film, a SiOF film and a SiOC film. It is desirable that the surface of the insulator layer 11 before formation of trenches 12 is as flat as possible.

After trenches 12 are formed on the insulator layer 11, the conductor layer 13 is formed on the insulator layer 11 such that the trenches 12 are at least completely filled. The conductor layer 13 is composed of a conductor metal. Specific examples of conductor metals include single metals such as tungsten, ruthenium, platinum, gold, hafnium, cobalt and nickel, and alloys having those single metals as bases. Because of small wiring resistance, the conductor metal constituting the conductor layer 13 is preferably tungsten, ruthenium, platinum or gold, more preferably tungsten or ruthenium, most preferably tungsten. The conductor layer 13 is formed according to, for example, a PVD (Physical Vapor Deposition) method.

Figure 2:
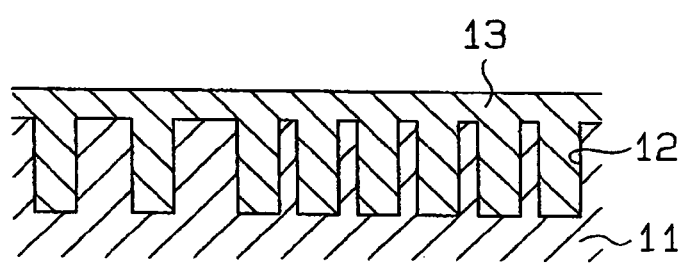

As shown in FIG. 2, in the second step, the conductor layer 13 formed on the insulator layer 11 is polished with the polishing composition according to the first embodiment to remove most parts of the conductor layer 13 outside trenches 12. The term "remove most parts of the conductor layer 13 outside trenches 12" means that the conductor layer 13 is removed until the thickness of the conductor layer 13 in areas outside trenches 12 is reduced to 200 nm or less, preferably 100 nm or less.

Figure 3:
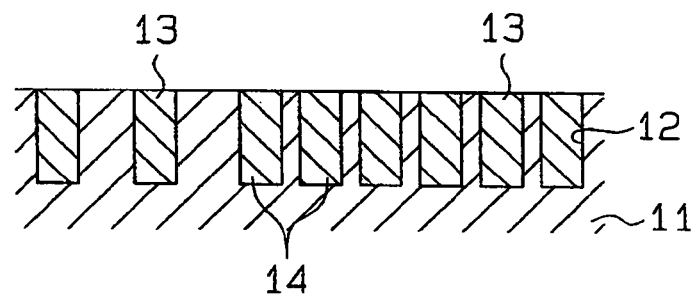
FIG. 3 is a fragmentary cross-sectional view showing a semiconductor device having a wiring structure formed using the polishing composition according to first and second embodiments of the present invention.
Figure 4:
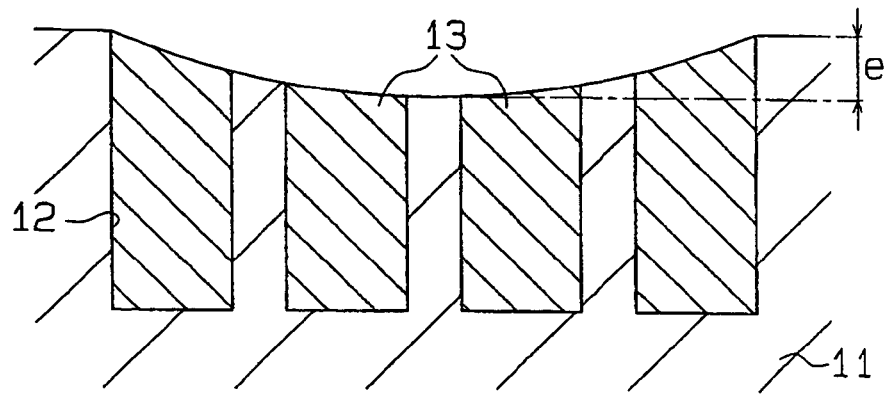
FIG. 4 is a cross-sectional view showing an enlarged part of semiconductor device in which erosion occurs.

As shown in FIG. 3, in the third step, the conductor layer 13 is finish-polished with a finish-polishing composition described later so that the insulator layer 11 in areas other than trenches 12 is exposed. By this finish-polishing, wiring portions 14 are formed in trenches 12, and the surface is flattened.

The finish-polishing composition for use during finish-polishing is preferably any of first to third finish-polishing compositions described below. The first finish-polishing composition is a polishing composition such that when a rate at which the conductor layer 13 is polished is 1, a rate at which the insulator layer 11 is polished is in the range of 0.67 to 1.5, preferably 0.75 to 1.2. The second finish-polishing composition is a polishing composition containing silicon dioxide as component a, periodic acid as component b, at least one component selected from ammonia, potassium hydroxide, sodium hydroxide, ammonium periodate, potassium periodate and sodium periodate as component c, water as component d, and containing substantially no iron. The third finish-polishing composition is a polishing composition such that when a rate at which the conductor layer 13 is polished is 1, a rate at which the insulator layer 11 is polished is in the range of 0.67 to 1.5, preferably 0.75 to 1.2, and also the polishing composition contains the above components a to d and contains substantially no iron.

The components a to d contained in aforesaid second and third finish-polishing compositions will now be described in detail.

First, silicon dioxide as component a will be described.

The type of silicon dioxide contained in the second and third finish-polishing compositions is not specifically limited. Preferable silicon dioxide is colloidal silica synthesized according to a sol-gel method. Synthesis of colloidal silica by the sol-gel method is generally carried out in such a manner that methyl silicate is dropped in a solvent composed of methanol, ammonia and water, and the methyl silicate is hydrolyzed. The colloidal silica synthesized in this way is characterized in that the content of impurities is extremely low.

The average particle size D1 of silicon dioxide is preferably 40 nm or greater, more preferably 60 nm or greater. Furthermore, the average particle size D1 is preferably 120 nm or less, more preferably 100 nm or less. The average particle size D2 is preferably 80 nm or greater, more preferably 150 nm or greater. Furthermore, the average particle size D2 is preferably 300 nm or less, more preferably 250 nm or less.

The content of silicon dioxide in the second and third finish-polishing compositions is preferably 10 g/liter or greater, more preferably 30 g/liter or greater. Furthermore, the content is preferably 200 g/liter or less, more preferably 150 g/liter or less.

The periodic acid as component b will now be described. The content of periodic acid in the second and third finish-polishing compositions is preferably 2 g/liter or greater, more preferably 3.5 g/liter or greater. Furthermore, the content is preferably 9 g/liter or less, more preferably 6 g/liter or less.

Ammonia, potassium hydroxide, sodium hydroxide, ammonium periodate, potassium periodate and sodium periodate as component c will now be described. The content of component c in the second and third finish-polishing compositions is preferably a content allowing the polishing composition to be kept at a pH of 4.5 to 7, more preferably 5 to 6, most preferably 5.3 to 5.8.

Finally, water as component d will be described. Water serves as a dispersion medium and solvent for components other than water contained in the second and third finish-polishing compositions. Preferably, as much as possible, the water contains no impurities. Preferable water is pure water, extrapure water and distilled water.

Other components are optionally added to the above components a to d to prepare the second and third finish-polishing compositions.

The pH of the finish-polishing composition is preferably 4.5 or greater, more preferably 5 or greater, most preferably 5.3 or greater. Furthermore, the pH is preferably 7 or less, more preferably 6 or less, most preferably 5.8 or less.

Preferably, as much as possible, the finish-polishing composition contains no impurities as much as possible. Specifically, the mass fractions of elements of the second to twelfth groups of the periodic table, aluminum, gallium, indium, thallium, tin, lead and bismuth are each preferably 100 ppb or less, more preferably 50 ppb or less. Copper, iron, nickel, chromium and manganese are particularly easily diffused into the insulator layer 11, thus causing a reduction in yield of the semiconductor device. Therefore, it is preferable that the mass fractions of particularly copper, iron, nickel, chromium and manganese are each within the above described range.

The first embodiment has the following advantages.

The polishing composition according to the first embodiment is comprised of silicon dioxide, at least one component selected from periodic acids and salts thereof, at least one component selected from tetraalkyl ammonium hydroxides and tetraalkyl ammonium chlorides, hydrochloric acid and water, and contains substantially no iron. Thus, no iron ions remain in a semiconductor device polished with the polishing composition according to the first embodiment. Therefore, there is no possibility that defects occur on the surface of the semiconductor device due to contamination by iron, or electrical characteristics of the semiconductor device are degraded.

The polishing composition according to the first embodiment has a high capability for polishing the conductor layer 13, especially the conductor layer 13 made of tungsten, owing to a synergic effect of mechanical polishing action of silicon dioxide and chemical polishing action of at least one component selected from periodic acids and salts thereof and hydrochloric acid. In other words, the polishing composition according to the first embodiment has a capability for polishing at a high rate the conductor layer 13, especially the conductor layer 13 made of tungsten. The reason why the polishing composition according to the first embodiment has a high capability for polishing tungsten is that at least one component selected from periodic acids and salts thereof changes tungsten into tungsten trioxide by oxidation action. Tungsten trioxide is so brittle that it can easily be removed by mechanical polishing action of silicon dioxide.

The tetraalkyl ammonium hydroxide or tetraalkyl ammonium chloride contained in the polishing composition according to the first embodiment lowers the capability for polishing the insulator layer 11 by the polishing composition according to the first embodiment. Therefore, polishing of the insulator layer 11 is inhibited during formation of a wiring structure for the semiconductor device.

If silicon dioxide contained in the polishing composition according to the first embodiment is fumed silica, a polishing composition is provided having a high capability for polishing the conductor layer 13 and a low capability for polishing the insulator layer 11, in other words, a polishing composition is provided having an increased rate at which the conductor layer is polished and a reduced rate at which the insulator layer is polished. This is inferred to be ascribable to a unique form of fumed silica in which a chain structure is formed with several to several tens of particles three-dimentionally agglomerated.

If the average particle size D1 of silicon dioxide contained in the polishing composition according to the first embodiment is 10 nm or greater, a polishing composition is provided having an increased rate at which a conductive layer is polished. If the average particle size D1 is 20 nm or greater, the rate at which the conductor layer is polished is still further increased.

If the average particle size D1 of silicon dioxide contained in the polishing composition according to the first embodiment is 50 nm or less, a polishing composition is provided having a reduced rate at which an insulator layer is polished. If the average particle size D1 is 40 nm or less, the rate at which the insulator layer is polished is still further reduced.

If the average particle size D2 of silicon dioxide contained in the polishing composition according to the first embodiment is 80 nm or greater, a polishing composition is provided having an increased rate at which a conductive layer is polished. If the average particle size D2 is 100 nm or greater, the rate at which the conductor layer is polished is still further increased.

If the average particle size D2 of silicon dioxide contained in the polishing composition according to the first embodiment is 250 nm or less, a polishing composition is provided having a reduced rate at which an insulator layer is polished. If the average particle size D2 is 200 nm or less, the rate at which the insulator layer is polished is still further reduced.

If the content of silicon dioxide contained in the polishing composition according to the first embodiment is 20 g/liter or greater, a polishing composition is provided having an increased rate at which a conductive layer is polished. If the content is 50 g/liter or greater, the rate at which the conductor layer is polished is still further increased.

If the content of silicon dioxide contained in the polishing composition according to the first embodiment is 200 g/liter or less, a polishing composition is provided having a reduced rate at which an insulator layer is polished. If the content is 150 g/liter or less, the rate at which the insulator layer is polished is still further reduced.

If the content of component B (at least one component selected from periodic acids and salts thereof) in the polishing composition according to the first embodiment is 5 g/liter or greater, a polishing composition is provided having an increased rate at which a conductor layer is polished. If the content is 10 g/liter or greater, the rate at which the conductor layer is polished is still further increased.

If the content of component B in the polishing composition according to the first embodiment is 50 g/liter or less, a polishing composition is provided having a reduced rate at which an insulator layer is polished. If the content is 30 g/liter or less, the rate at which the insulator layer is polished is still further reduced.

If the mass fraction of hydrochloric acid in the polishing composition according to the first embodiment is 10 ppm or greater, a polishing composition is provided having an increased rate at which a conductor layer is polished and a reduced rate at which an insulator layer is polished. If the mass fraction is 30 ppm or greater, the rate at which the conductor layer is still further increased, and the rate at which the insulator layer is still further reduced.

If the mass fraction of hydrochloric acid in the polishing composition according to the first embodiment is 1000 ppm or less, gelation of the polishing composition according to the first embodiment is prevented. If the mass fraction is 200 ppm or less, the gelation is reliably prevented. The gelated polishing composition according to the first embodiment causes polishing scars to occur on the polished surface.

If the pH of the polishing composition according to the first embodiment is 2 or greater, a polishing composition is provided having an increased rate at which a conductor layer is polished and a reduced rate at which an insulator layer is polished. In addition, handling characteristics of the polishing composition according to the first embodiment are improved. If the pH is 2.1 or greater, the rate at which the conductor layer is polished is still further increased, and the rate at which the insulator layer is polished is still further reduced.

If the pH of the polishing composition according to the first embodiment is 3 or less, gelation of the polishing composition according to the first embodiment is prevented. If the pH is 2.8 or less, the gelation is reliably prevented.

If the mass fractions of elements of the second to twelfth groups of the periodic table, aluminum, gallium, indium, thallium, tin, lead and bismuth in the polishing composition according to the first embodiment are each 100 ppb or less, contamination of the semiconductor device by these elements is inhibited. If the mass fraction is 50 ppb or less, the contamination is considerably inhibited. Contamination of the semiconductor device by aluminum and the like causes occurrence of surface defects and degradation in electrical characteristics.

If finish-polishing is performed using a polishing composition such that when a rate at which the conductor layer is polished is 1, a rate at which the insulator layer is polished is in the range of 0.67 to 1.5, the conductor layer and the insulator layer are polished at almost the same rates, and therefore a flat finished surface is obtained. If finish-polishing is performed using a polishing composition such that when a rate at which the conductor layer is polished is 1, a rate at which the insulator layer is polished is in the range of 0.75 to 1.2, and the flatness of the finished surface is still further improved.

If finish-polishing is performed using a finish-polishing composition containing the above components a to d and containing substantially no iron, contamination of the semiconductor by iron is prevented.

If finish-polishing is performed using a polishing composition such that when a rate at which the conductor layer is polished is 1, a rate at which the insulator layer is polished is in the range of 0.67 to 1.5, and the finish-composition contains the above components a to d and contains substantially no iron, a flat finished surface is obtained, and also contamination by iron is prevented.

If the average particle size D1 of silicon dioxide contained in the finish-polishing composition is 40 nm or greater, a finish-polishing composition is provided having an increased rate at which a conductor layer is polished and also an increased rate at which an insulator layer is polished. If the average particle size D1 is 60 nm or greater, the rate at which the conductor layer is polished and the rate at which the insulator layer is polished are still further increased.

If the average particle size D1 of silicon dioxide contained in the finish-polishing composition is 120 nm or less, the finish-polishing composition has an adequate viscosity, and dispersibility of silicon dioxide is improved. If the average particle size D1 is 100 nm or less, dispersibility of silicon dioxide is still further improved. Poor dispersibility of silicon dioxide causes polishing scars to occur on the polished surface.

If the average particle size D2 of silicon dioxide contained in the finish-polishing composition is 80 nm or greater, a finish-polishing composition is provided having an increased rate at which a conductor layer is polished and an increased rate at which an insulator layer is polished. If the average particle size D2 is 150 nm or greater, the rate at which the conductor layer is polished and the rate at which the insulator layer is polished are still further increased.

If the average particle size D2 of silicon dioxide contained in the finish-polishing composition is 300 nm or less, the finish-polishing composition has an adequate viscosity, and dispersibility of silicon dioxide is improved. If the average particle size D2 is 250 nm or less, dispersibility of silicon dioxide is still further improved.

If the content of silicon dioxide contained in the finish-polishing composition is 10 g/liter or greater, a finish-polishing composition is provided having an increased rate at which a conductor layer is polished and an increased rate at which an insulator layer is polished. If the content is 30 g/liter or greater, the rate at which the conductor layer is polished and the rate at which the insulator layer is polished are still further increased.

If the content of silicon dioxide contained in the finish-polishing composition is 200 g/liter or less, the finish-polishing composition has an adequate viscosity, and dispersibility of silicon dioxide is improved. If the content is 150 g/liter or less, dispersibility of silicon dioxide is still further improved.

If the content of periodic acid in the finish-polishing composition is 2 g/liter or greater, a finish-polishing composition is provided having an increased rate at which a conductor layer is polished and an increased rate at which an insulator layer is polished. If the content is 3.5 g/liter or greater, the rate at which the conductor layer is polished and the rate at which the insulator layer is polished are still further increased.

If the content of periodic acid in the finish-polishing composition is 9 g/liter or less, the finish-polishing composition has adequate oxidation power. If the content is 6 g/liter or less, it has a more adequate oxidation power.

If the pH of the finish-polishing composition is 4.5 or greater, a finish-polishing composition is provided having an increased rate at which a conductor layer is polished. If the pH is 5 or greater, the rate at which the conductor layer is polished is further increased, and if the pH is 5.3 or greater, the rate at which the conductor layer is polished is still further increased.

If the pH of the finish-polishing composition is 7 or less, a finish-polishing composition is provided having an increased rate at which an insulator layer is polished is provided. If the pH is 6 or less, the rate at which the insulator layer is polished is further increased, and if the pH is 5.8 or less, the rate at which the insulator layer is polished is still further increased.

If the mass fractions of elements of the second to twelfth groups of the periodic table, aluminum, gallium, indium, thallium, tin, lead and bismuth in the finish-polishing composition are each 100 ppb or less, contamination of the semiconductor device by these elements is inhibited. If the mass fraction is 50 ppb or less, the contamination is considerably inhibited.

A second embodiment of the present invention will be described below.

A polishing composition according to the second embodiment is comprised of fumed silica as component A', at least one component selected from periodic acids and salts thereof as component B', a tetraalkyl ammonium salt represented by the general formula (1) described below as component C', at least one component selected from ethylene glycol and propylene glycol as component D', and water as component E', ammonium nitrate as F' component, and at least one component selected from benzotriazole and derivatives thereof as G':

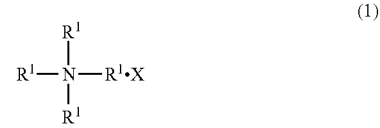

$R^1$ in the general formula (1) represents a hydrocarbon group having 1 to 4 carbon atoms, and X represents a hydroxy group or a halogen atom.

The average particle size D1 of fumed silica as component A' is preferably 10 to 50 nm, more preferably 20 to 40 nm. The average particle size D2 of fumed silica is preferably 80 to 250 nm, more preferably 100 to 200 nm. If the average particle size D1 is less than 10 nm or the average particle size D2 is less than 80 nm, the rate at which a conductor layer is polished is insufficient. If the average particle size D1 is greater than 50 nm or the average particle size D2 is greater than 250 nm, the rate at which an insulator layer is polished is so high that erosion amount increases.

It is essential that the content of fumed silica in the polishing composition according to the second embodiment is greater than 20 g/liter and also 200 g/liter or less, and is preferably 50 to 100 g/liter. If the content is 20 g/liter or less, the rate at which the conductor layer is polished is insufficient, thus increasing the amount of polishing time. An increase in the amount of polishing time causes the erosion amount to be increased. If the content is greater than 200 g/liter, the viscosity is excessively increased to make handling difficult, and storage stability is lowered.

A periodic acid preferable as component B' is orthoperiodic acid. Periodates preferable as component B' are ammonium periodate, potassium periodate and sodium periodate.

It is essential that the content of component B' in the polishing composition according to the second embodiment be greater than 5 g/liter and also 25 g/liter or less, and is preferably 7.5 to 17.5 g/liter. If the content is 5 g/liter or less, the rate at which the conductor layer is polished is insufficient, thus increasing the amount of polishing time. If the content is greater than 25 g/liter, the rate at which the insulator layer is polished increases, resulting in an increase in erosion amount.

Component C' reduces the rate at which the insulator layer is polished by the polishing composition according to the second embodiment. Specific examples of the hydrocarbon group $R_1$ having 1 to 4 carbon atoms in the tetraalkyl ammonium salt represented by the general formula (1) described above include saturated hydrocarbon groups, unsaturated hydrocarbon groups, straight-chain hydrocarbon groups and branched hydrocarbon groups. A preferable hydrocarbon group $R_1$ is a straight-chain saturated hydrocarbon group having less than 3 carbon atoms, specifically a methyl group and an ethyl group.

The content of component C' in the polishing composition according to the second embodiment is preferably a content allowing the polishing composition to be kept at pH of 1.8 or greater to less than 4.0, more preferably 2.0 to 3.0.

Ethylene glycol and propylene glycol inhibit excessive chemical action on the conductor layer 13, and prevents the conductor layer 13 in the trenches 12 from being polished. If the conductor layer 13 in the trenches 12 is polished, polishing pressure is focused on the surface of the insulator layer 11 between neighboring trenches 12, and therefore the erosion amount is increased. On the other hand, polyethylene glycol and polypropylene glycol have an extremely strong effect of inhibiting chemical action on the conductor layer 13. Thus, a polishing composition containing polyethylene glycol and polypropylene glycol instead of ethylene glycol and propylene glycol has an insufficient rate at which the conductor layer is polished.

The content of component D' in the polishing composition according to the second embodiment is preferably 0.03 to 2.0 g/liter, more preferably 0.08 to 1.0 g/liter. If the content is less than 0.03 g/liter, the effect of inhibiting excessive chemical action on the conductor layer 13 is insufficient, resulting in an increase in erosion amount. In addition, surface defects may occur on a polished surface. If the content is greater than 2.0 g/liter, storage stability is degraded, resulting in occurrence of precipitation and separation.

Water as component E' serves as a dispersant and solvent for components other than water contained in the polishing composition according to the second embodiment. Preferably, as much as possible, the water contains no impurities. Preferable water is pure water, extrapure water and distilled water.

Ammonium nitrate as F' component facilitates chemical polishing action of component B' to improve the rate at which the conductor layer is polished by the polishing composition according to the second embodiment. The content of ammonium nitrate in the polishing composition according to the second embodiment is preferably 5 to 30 g/liter, more preferably 10 to 25 g/liter. If the content is less than 5 g/liter, the rate at which the conductor is polished is not sufficiently improved. If the content is greater than 30 g/liter, the rate at which the conductor layer is polished is so high that surface defects may occur on the polished surface.

Benzotriazole and derivatives thereof as G' component protect the surface of the conductor layer 13 to prevent corrosion of the conductor layer 13. Benzotriazole is more effective in protecting the surface of the conductor layer 13 than benzotriazole derivatives. Benzotriazole and derivatives thereof are each represented by the general formula described below (2):

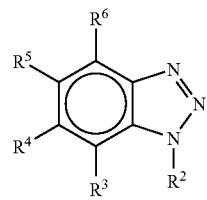

$R^2$ in the general formula (2) represents an alkyl group such as an alkyl group containing a carboxyl group, an alkyl group containing a hydroxy group and a tertiary amino group and an alkyl group containing a hydroxy group, or a hydrogen atom. $R^3$ to $R^6$ each represent a hydrogen atom or an alkyl group. The carbon atom at the fourth, fifth, sixth or seventh position may be replaced with a nitrogen atom. The nitrogen atom at the first position may be replaced with a carbon atom.

The content of G' component in the polishing composition according to the second embodiment is preferably 0.05 to 3.5 g/liter, more preferably 0.15 to 1.5 g/liter. If the content is less than 0.05 g/liter, the effect of protecting the surface of the conductor layer 13 is insufficient. If the content is greater than 3.5 g/liter, the surface of the conductor layer 13 is excessively protected, and thus the rate at which the conductor layer is polished becomes insufficient. In addition, dissolution stability of the G' component is degraded, resulting in occurrence of precipitation and separation.

The A' to G' components are mixed to prepare the polishing composition according to the second embodiment. The pH of the polishing composition according to the second embodiment should be 1.8 or greater to less than 4.0, and is preferably 2.0 to 3.0. If the pH is less than 1.8, the rate at which the insulator layer is polished becomes so high that the erosion amount is increased and in addition, handling characteristics are lowered. If the pH is 4.0 or greater, the rate at which the insulator layer is polished becomes so high that the erosion amount is increased. In addition, dispersion stability is degraded, resulting in occurrence of separation and gelation.

Preferably, the polishing composition according to the second embodiment contains no impurities as much as possible. Specifically, the mass fractions of elements of the second to twelfth groups of the periodic table, aluminum, gallium, indium, thallium, tin, lead and bismuth are each preferably 100 ppb or less, more preferably 50 ppb or less. Copper, iron, nickel, chromium and manganese are particularly easily diffused into the insulator layer 11 of the semiconductor device, thus causing a reduction in yield of the semiconductor device. Therefore, it is preferable that the mass fractions of particularly copper, iron, nickel, chromium and manganese are each within the above described range.

The content of chlorine contained as an impurity in fumed silica as component A' is preferably a content allowing the mass fraction of chlorine in the polishing composition according to the second embodiment to be kept at a 1,000 ppm or less, more preferably 200 ppm or less. If the mass fraction is greater than 1,000 ppm, stability of the polishing composition according to the second embodiment is degraded, resulting in occurrence of gelation.

The rate at which the conductor layer is polished by the polishing composition according to the second embodiment is preferably 200 to 500 nm/min, more preferably 300 to 400 nm/min. If the polishing rate is less than 200 nm/min, the amount of polishing time increases. If the polishing rate is greater than 500 nm/min, it is difficult to maintain the polishing rate with stability.

The polishing composition according to the second embodiment is used in formation of a wiring structure in a semiconductor device. The method for forming the wiring structure using the polishing composition according to the second embodiment is same as the method for forming the wiring structure using the polishing composition according to the first embodiment.

The polishing composition according to the second embodiment has a high capability for polishing the conductor layer 13, especially the conductor layer 13 made of tungsten, owing to a synergic effect of mechanical polishing action of silicon dioxide and chemical polishing action of at least one component selected from periodic acids and salts thereof. On the other hand, the polishing composition according to the second embodiment has a reduced capability for polishing the insulator layer 11 due to a synergic effect of action of a tetraalkyl ammonium salt represented by the general formula (1), and action of a pH set to be 1.8 or greater to less than 4.0. Thus, in a semiconductor device polished with the polishing composition according to the second embodiment, erosion is inhibited to reduce the erosion amount.

The first and second embodiments may be altered as follows.

The polishing composition according to the first and second embodiments may contain various kinds of additives that are generally used in conventional polishing compositions, such as an anti-forming agent, for example.

The polishing composition according to the second embodiment is not necessarily required to contain both the F' component and G' component.

In the method for forming a wiring structure according to the first embodiment, a finish-polishing composition is used in the third step, but the polishing composition according to the first embodiment may be used instead of the finish-polishing composition. That is, only the polishing composition according to the first embodiment may be used to polish the conductor layer 13 so that the insulator layer 11 in areas other than trenches 12 is exposed.

In the method for forming a wiring structure according to the second embodiment, a finish-polishing composition is used in the third step, but the polishing composition according to the second embodiment may be used instead of the finish-polishing composition. That is, only the polishing composition according to the second embodiment may be used to polish the conductor layer 13 so that the insulator layer 11 in areas other than trenches 12 is exposed.

In the method for forming a wiring structure according to the first and second embodiments, the conductor layer 13 is formed directly on the insulator layer 11. In contrast, a primary coat composed of titanium or titanium nitrate may be formed on the insulator layer 11, followed by forming the conductor layer 13 on the primary coat. That is, a metal layer comprised of the primary coat and the conductor layer 13 may be formed on the insulator layer 11 having trenches 12 on the surface. In this case, in the third step, the metal layer is polished so that the insulator layer 11 in areas other than trenches 12 is exposed, whereby wiring portions 14 are formed. The primary coat prevents the conductor layer 13, hence the wiring portions 14 from being peeled off from the insulator layer 11.

The polishing composition and finish-polishing composition according to the first and second embodiments may be provided in the form of a multiple agent system comprised of two or more agents that are mixed when used. The polishing component according to the first embodiment may be provided in the form of a double agent system comprised of a first agent containing component A, component D and component E and a second agent containing component B, component C and component E, for example. The polishing composition according to the second embodiment may be provided in the form of a double agent system comprised of a first agent containing component A' and component E' and a second agent containing component B', component C', component D' and component E', for example. The finish-polishing component may be provided in the form a double agent system comprised of a first agent containing component a and component d and a second agent containing component b, component c and component d, for example. This improves storage stability. In addition, by adjusting the mixing ratio of the agents according to the state of a polisher and environments during polishing, the polishing rate can be finely adjusted.

The polishing composition according to the first and second embodiments may be provided as a concentrated stock solution. In this case, the polishing composition according to the first and second embodiments is diluted with water when used for polishing. This improves handling characteristics during storage and transportation.

EXAMPLES

The present invention will now be more specifically described with Examples and Comparative Examples.

Examples 1 to 26 and Comparative Examples 1 to 5

In Examples 1 to 24, fumed silica, periodic acid, hydrochloric acid, tetramethyl ammonium hydroxide and water were mixed to prepare a polishing composition. In Example 25, fumed silica, periodic acid, potassium periodate, hydrochloric acid, tetramethyl ammonium hydroxide and water were mixed to prepare a polishing composition. In Example 26, colloidal silica, periodic acid, hydrochloric acid, tetramethyl ammonium hydroxide and water were mixed to prepare a polishing composition. In Comparative Example 1, fumed silica, hydrochloric acid, tetramethyl ammonium hydroxide and water were mixed to prepare a polishing composition. In Comparative Example 2, fumed silica, periodic acid, tetramethyl ammonium hydroxide and water were mixed to prepare a polishing composition. In Comparative Example 3, fumed silica, periodic acid, hydrochloric acid and water were mixed to prepare a polishing composition. In Comparative Example 4, fumed silica, periodic acid, hydrochloric acid, potassium hydroxide and water were mixed to prepare a polishing composition. In Comparative Example 5, fumed silica, iron nitrate, hydrochloric acid, tetramethyl ammonium hydroxide and water were mixed to prepare a polishing composition.

The contents of fumed silica and periodic acid and the mass fractions of chlorine in polishing compositions prepared in Examples 1 to 26 and Comparative Examples 1 to 5, and the pHs of the polishing compositions are shown in Table 1 below. The contents of tetramethyl ammonium hydroxide in polishing compositions prepared in Examples and Comparative Examples other than Comparative Examples 3 and 4, and the content of potassium hydroxide in the polishing composition prepared in Comparative Example 4 are contents allowing the pHs of the respective polishing compositions to have the values shown in Table 1. The average particle size D1 and the average particle size D2 of fumed silica contained in the polishing compositions prepared in Examples 1 to 25 and Comparative Examples 1 to 5 are 30 nm and 100 nm, respectively.

Examples 27 to 39

In Examples 27 to 29, fumed silica, periodic acid, hydrochloric acid, tetramethyl ammonium hydroxide and water were mixed to prepare a polishing composition. The average particle size D1 and the average particle size D2 of fumed silica contained in the polishing compositions prepared in Examples 27 to 39 are shown in Table 2. The content of fumed silica in polishing compositions prepared in Examples 27 to 39 is 100 g/liter, the content of periodic acid is 20 g/liter, the mass fraction of chlorine is 100 ppm, and the content of tetramethyl ammoniun hydroxide is a content allowing the polishing composition to be kept at pH of 2.3.

Using polishing compositions prepared in Examples 1 to 39 and Comparative Examples 1 to 5, a blanket wafer of tungsten and a blanket wafer of $SiO_2$ were polished for 1 minute in accordance with polishing conditions (1) described below. At this time, the tungsten polishing rate and the $SiO_2$ polishing rate of each polishing composition was determined based on the equation described below. In addition, the concentration of iron ion on the surface of each polished wafer with each polishing composition was measured using Total Reflection X-ray Fluorescence analyzer (TRE-610T manufactured by Technos Co., Ltd.). The results are shown in Tables 1 and 2.

Polishing rate [nm/min]=(thickness [nm] of non-polished blanket wafer−thickness [nm] of polished blanket wafer)÷polishing time [min]

The thicknesses of the blanket wafer of tungsten before and after polishing were measured using a sheet resistance measuring apparatus (VR-120 manufactured by International Electric System Service Co., Ltd.). The thickness of the blanket wafer of $SiO_2$ before and after polishing were measured using an optical film thickness measuring apparatus manufactured by Dainippon Screen Manufacture Co., Ltd.

Polishing Conditions (1)

Polisher: polisher for one side CMP (Mirra manufactured by Applied Materials Co., Ltd.); polishing pad: laminated polishing pad made of polyurethane (IC-1000/Suba 400 manufactured by Rodel Co., Ltd.); polishing pressure: 4 psi (=28 kPa), platen speed: 80 rpm, rate of feed of polishing composition: 150 ml/minute, carrier speed: 80 rpm.

TABLE 1

| | Fumed silica (g/L) | Periodic acid (g/L) | Chlorine (ppm) | pH | Tungsten polishing rate (nm/min) | $SiO_2$ polishing rate (nm/min) | Concentration of iron ion on the surface of wafer Atms/cm$^2$ |
|---|---|---|---|---|---|---|---|
| Ex. 1 | 10 | 20 | 100 | 2.3 | 250 | 3 | $<1 \times 10^{10}$ |
| Ex. 2 | 20 | 20 | 100 | 2.3 | 270 | 3.5 | $<1 \times 10^{10}$ |
| Ex. 3 | 50 | 20 | 100 | 2.3 | 320 | 4.5 | $<1 \times 10^{10}$ |
| Ex. 4 | 100 | 20 | 100 | 2.3 | 380 | 6 | $<1 \times 10^{10}$ |
| Ex. 5 | 150 | 20 | 100 | 2.3 | 395 | 8 | $<1 \times 10^{10}$ |
| Ex. 6 | 200 | 20 | 100 | 2.3 | 410 | 10 | $<1 \times 10^{10}$ |
| Ex. 7 | 250 | 20 | 100 | 2.3 | 420 | 13 | $<1 \times 10^{10}$ |
| Ex. 8 | 100 | 3 | 100 | 2.3 | 120 | 6 | $<1 \times 10^{10}$ |
| Ex. 9 | 100 | 5 | 100 | 2.3 | 180 | 6 | $<1 \times 10^{10}$ |
| Ex. 10 | 100 | 10 | 100 | 2.3 | 270 | 6.5 | $<1 \times 10^{10}$ |
| Ex. 11 | 100 | 30 | 100 | 2.3 | 410 | 8 | $<1 \times 10^{10}$ |
| Ex. 12 | 100 | 50 | 100 | 2.3 | 420 | 9 | $<1 \times 10^{10}$ |
| Ex. 13 | 100 | 80 | 100 | 2.3 | 440 | 10 | $<1 \times 10^{10}$ |
| Ex. 14 | 100 | 20 | 5 | 2.3 | 350 | 9 | $<1 \times 10^{10}$ |
| Ex. 15 | 100 | 20 | 10 | 2.3 | 360 | 9 | $<1 \times 10^{10}$ |
| Ex. 16 | 100 | 20 | 30 | 2.3 | 375 | 8 | $<1 \times 10^{10}$ |
| Ex. 17 | 100 | 20 | 200 | 2.3 | 385 | 6 | $<1 \times 10^{10}$ |
| Ex. 18 | 100 | 20 | 1000 | 2.3 | 395 | 4 | $<1 \times 10^{10}$ |
| Ex. 19 | 100 | 20 | 2000 | 2.3 | 420 | 2 | $<1 \times 10^{10}$ |
| Ex. 20 | 100 | 20 | 100 | 1.8 | 255 | 10 | $<1 \times 10^{10}$ |
| Ex. 21 | 100 | 20 | 100 | 2.0 | 340 | 9.5 | $<1 \times 10^{10}$ |
| Ex. 22 | 100 | 20 | 100 | 2.1 | 350 | 9 | $<1 \times 10^{10}$ |
| Ex. 23 | 100 | 20 | 100 | 2.8 | 380 | 8 | $<1 \times 10^{10}$ |
| Ex. 24 | 100 | 20 | 100 | 3.0 | 400 | 8 | $<1 \times 10^{10}$ |
| Ex. 25 Note1 | 100 | 10 | 100 | 2.3 | 370 | 8 | $<1 \times 10^{10}$ |
| Ex. 26 Note2 | — | 20 | 100 | 2.3 | 250 | 80 | $<1 \times 10^{10}$ |
| C. Ex. 1 | 100 | — | 100 | 2.3 | 20 | 5 | $<1 \times 10^{10}$ |
| C. Ex. 2 | 100 | 20 | — | 2.3 | 280 | 11 | $<1 \times 10^{10}$ |
| C. Ex. 3 | 100 | 20 | 100 | 1.5 | 240 | 30 | $<1 \times 10^{10}$ |
| C. Ex. 4 | 100 | 20 | 100 | 2.3 | 240 | 80 | $<1 \times 10^{10}$ |
| C. Ex. 5 Note3 | 100 | — | 100 | 2.3 | 400 | 7 | $3 \times 10^{12}$ |

Note1: The polishing composition of Example 25 further contains 10 g/L of potassium periodate.
Note2: The polishing composition of Example 26 further contains 100 g/L of colloidal silica.
Note3: The polishing composition of Comparative Example 5 further contains 20 g/L of iron nitrate.

TABLE 2

| | D1 (nm) | D2 (nm) | Tungsten polishing rate (nm/min) | SiO$_2$ polishing rate (nm/min) | Concentration of iron ion on the surface of wafer Atms/cm$^2$ |
|---|---|---|---|---|---|
| Ex. 27 | 7 | 100 | 200 | 1.5 | <1 × 10$^{10}$ |
| Ex. 28 | 10 | 100 | 250 | 2 | <1 × 10$^{10}$ |
| Ex. 29 | 20 | 100 | 320 | 4 | <1 × 10$^{10}$ |
| Ex. 30 | 30 | 100 | 380 | 6 | <1 × 10$^{10}$ |
| Ex. 31 | 40 | 100 | 385 | 8 | <1 × 10$^{10}$ |
| Ex. 32 | 50 | 100 | 390 | 10 | <1 × 10$^{10}$ |
| Ex. 33 | 70 | 100 | 400 | 12 | <1 × 10$^{10}$ |
| Ex. 34 | 30 | 40 | 320 | 4 | <1 × 10$^{10}$ |
| Ex. 35 | 30 | 50 | 340 | 4.5 | <1 × 10$^{10}$ |
| Ex. 36 | 30 | 80 | 360 | 5 | <1 × 10$^{10}$ |
| Ex. 37 | 30 | 150 | 400 | 6.5 | <1 × 10$^{10}$ |
| Ex. 38 | 30 | 200 | 405 | 7.5 | <1 × 10$^{10}$ |
| Ex. 39 | 30 | 250 | 410 | 8 | <1 × 10$^{10}$ |

As shown in Tables 1 and 2, polishing compositions of Examples 1 to 39 had increased tungsten polishing rates compared to the polishing composition of Comparative Example 1 containing no periodic acid. Polishing compositions of Examples 1 to 39 had less concentrations of iron ion on the surface of the polished wafer compared to the polishing composition of Comparative Example 5 containing iron nitrate. The polishing composition of Comparative Example 2 containing no hydrochloric acid and polishing compositions of Comparative Examples 3 and 4 containing no tetramethyl ammonium hydroxide had reduced tungsten polishing rates and increased SiO$_2$ polishing rates.

Examples 40 to 58

In Examples 40 to 58, a pattern wafer was polished for 1 minute in accordance with the above polishing conditions (1) using the polishing composition prepared in Example 4, and then finish-polished using a finish-polishing composition in accordance with the polishing conditions (2) described below. After the pattern wafer was finish-polished, the amount of dishing and the amount of erosion in an area of the pattern wafer having a density of 50% and a hole diameter of 1 μm, namely the area of the pattern wafer on which wiring portions relatively densely, where measured. The results are shown in Table 3 below. The finish-polishing composition used in each Example was prepared by mixing colloidal silica, periodic acid, ammonia and water. The contents of colloidal silica and periodic acid in the finish-polishing composition and the pH of the finish-polishing are shown in Table 3 below. In addition, the tungsten polishing rate and SiO$_2$ polishing rate of the finish-polishing composition used in each Example and the ratio of the polishing rates (SiO$_2$ polishing rate/tungsten polishing rate) are shown in Table 3 below. relatively densely, were measured. The results are shown in Table 3 below. The finish-polishing composition used in each Example was prepared by mixing colloidal silica, periodic acid, ammonia and water. The contents of colloidal silica and periodic acid in the finish-polishing composition and the pH of the finish-polishing are shown in Table 3 below. In addition, the tungsten polishing rate and SiO$_2$ polishing rate of the finish-polishing composition used in each Example and the ratio of the polishing rates (SiO$_2$ polishing rate/tungsten Polishing Conditions (2)

Polisher: polisher for one side CMP (Mirra manufactured by Applied Materials Co., Ltd.); polishing pad: composite polishing pad made of polyurethane (IC-1000/Suba 400 manufactured by Rodel Co., Ltd.); polishing pressure: 4 psi (=28 kPa), polishing time: 60 seconds, platen speed: 60 rpm, rate of feed of polishing composition: 200 ml/minute, carrier speed: 60 rpm.

TABLE 3

| | Colloidal silica (g/L) | Periodic acid (g/L) | pH | Tungsten polishing rate (nm/min) | SiO$_2$ polishing rate (nm/min) | Ratio of polishing rates | Dishing (nm) | Erosion (nm) |
|---|---|---|---|---|---|---|---|---|
| Ex. 40 | 7 | 4 | 5.5 | 27 | 35 | 1.30 | 1 | 12 |
| Ex. 41 | 10 | 4 | 5.5 | 32 | 40 | 1.25 | 2 | 11 |
| Ex. 42 | 30 | 4 | 5.5 | 48 | 555 | 1.15 | 3 | 10 |
| Ex. 43 | 80 | 4 | 5.5 | 90 | 95 | 1.06 | 5 | 9 |
| Ex. 44 | 150 | 4 | 5.5 | 120 | 130 | 1.08 | 4 | 9 |
| Ex. 45 | 200 | 4 | 5.5 | 135 | 150 | 1.11 | 4 | 10 |
| Ex. 46 | 250 | 4 | 5.5 | 145 | 160 | 1.10 | 3 | 9 |
| Ex. 47 | 80 | 1.5 | 5.5 | 62 | 92 | 1.48 | −1 | 14 |
| Ex. 48 | 80 | 2 | 5.5 | 68 | 93 | 1.37 | 0 | 13 |
| Ex. 49 | 80 | 3.5 | 5.5 | 81 | 94 | 1.16 | 2 | 11 |
| Ex. 50 | 80 | 6 | 5.5 | 108 | 94 | 0.87 | 9 | 6 |
| Ex. 51 | 80 | 9 | 5.5 | 135 | 96 | 0.71 | 13 | 4 |
| Ex. 52 | 80 | 12 | 5.5 | 145 | 96 | 0.66 | 15 | 3 |
| Ex. 53 | 80 | 4 | 4.8 | 79 | 118 | 1.49 | −2 | 15 |
| Ex. 54 | 80 | 4 | 5 | 81 | 112 | 1.38 | 0 | 12 |
| Ex. 55 | 80 | 4 | 5.3 | 85 | 100 | 1.18 | 2 | 10 |
| Ex. 56 | 80 | 4 | 5.8 | 91 | 85 | 0.93 | 7 | 7 |
| Ex. 57 | 80 | 4 | 6 | 96 | 77 | 0.80 | 11 | 5 |
| Ex. 58 | 80 | 4 | 6.2 | 102 | 70 | 0.69 | 15 | 3 |

As shown in Table 3, in each of Examples 40 to 58, the sum of the amount of dishing and the amount of erosion was equal to or less than 20 nm. This indicates that a flat finished surface was obtained.

Examples 101 to 117 and Comparative Examples 101 to 110

In Examples 101 to 105 and 107 to 117, and Comparative Examples 101, 102, 104, and 106 to 108, fumed silica, ortho-periodic acid, tetramethyl ammonium hydroxide, ethylene glycol, water, ammonium nitrate and benzotriazole were mixed to prepare a polishing composition. In Example 106, fumed silica, ortho-periodic acid, tetramethyl ammonium hydroxide, ethylene glycol, water and benzotriazole were mixed to prepare a polishing composition. In Comparative Example 103, fumed silica, tetramethylammonium hydroxide, ethylene glycol, water, ammonium nitrate and benzotriazole were mixed to prepare a polishing composition. In Comparative Example 105, fumed silica, ortho-periodic acid, tetramethyl ammonium hydroxide, water and ammonium nitrate were mixed to prepare a polishing composition. In Comparative Example 106, fumed silica, ortho-periodic acid, ethylene glycol, water, ammonium nitrate and benzotriazole were mixed to prepare a polishing composition. In Comparative Example 109, ortho-periodic acid, tetramethyl ammonium hydroxide, ethylene glycol, water, ammonium nitrate and benzotriazole were mixed to prepare a polishing composition. In Comparative Example 110, finned alumina, ortho-periodic acid, tetramethyl ammonium hydroxide, ethylene glycol, water, ammonium nitrate and benzotriazole were mixed to prepare a polishing compositor.

The contents of fumed silica, ortho-periodic acid, ethylene glycol, ammonium nitrate and benzotriazole in polishing compositions prepared in Examples 101 to 117 and Comparative Examples 101 to 110, and the pHs of the polishing compositions are shown in Table 4 below. The content of tetramethyl ammonium hydroxide in the polishing composition prepared in each Example other than Comparative Example 106 is a content allowing the pH of the polishing composition to have the values shown in Table 4. The average particle size D1 and the average particle size D2 of fumed silica and fumed alumina are 30 nm and 100 nm, respectively.

Using polishing compositions prepared in Examples 101 to 117 and Comparative Examples 101 to 110, the blanket wafer of tungsten was polished for 1 minute in accordance with the polishing conditions (1) described above. The tungsten polishing rate of each polishing composition was determined based on the equation described above. The results are shown in Table 4.

Using polishing compositions prepared in Examples 101 to 117 and Comparative Examples 101 to 110, the pattern wafer was polished in accordance with the polishing conditions described above. The pattern wafer was polished until the an end point was detected by an end point detector, i.e. a tungsten film with a thickness of 500 nm covering the surface of the pattern wafer was completely polished. After the pattern wafer was polished, the amount of erosion on an area of the pattern wafer on which wiring portions exist relatively densely was measured using a probe profiler (HRP 340 manufactured by KLA-Tencor Co., Ltd.). The results are shown in Table 4.

TABLE 4

| | Fumed silica (g/L) | Ortho-periodic acid (g/L) | Ethylene glycol (g/L) | Ammonium nitrate (g/L) | Benzo-triazole (g/L) | pH | Tungsten polishing rate (Å/min) | Erosion amount (Å) |
|---|---|---|---|---|---|---|---|---|
| Ex. 101 | 50 | 10 | 0.325 | 10 | 0.175 | 2.2 | 3150 | 600 |
| Ex. 102 | 100 | 10 | 0.325 | 10 | 0.175 | 2.2 | 3300 | 440 |
| Ex. 103 | 200 | 10 | 0.325 | 10 | 0.175 | 2.2 | 3400 | 430 |
| Ex. 104 | 100 | 15 | 0.325 | 10 | 0.175 | 2.2 | 3700 | 560 |
| Ex. 105 | 100 | 20 | 0.325 | 10 | 0.175 | 2.2 | 4200 | 600 |
| Ex. 106 | 100 | 10 | 0.325 | 0 | 0.175 | 2.2 | 1800 | 530 |
| Ex. 107 | 100 | 10 | 0.325 | 2.5 | 0.175 | 2.2 | 2500 | 540 |
| Ex. 108 | 100 | 10 | 0.325 | 15 | 0.175 | 2.2 | 2800 | 510 |
| Ex. 109 | 100 | 10 | 0.325 | 10 | 0.175 | 2.2 | 3600 | 490 |
| Ex. 110 | 100 | 10 | 0.065 | 10 | 0.035 | 2.2 | 3300 | 600 |
| Ex. 111 | 100 | 10 | 0.195 | 10 | 0.105 | 2.2 | 3300 | 530 |
| Ex. 112 | 100 | 10 | 0.65 | 10 | 0.35 | 2.2 | 3400 | 560 |
| Ex. 113 | 100 | 10 | 1.95 | 10 | 1.05 | 2.2 | 3400 | 560 |
| Ex. 114 | 100 | 10 | 3.25 | 10 | 1.75 | 2.2 | 3300 | 560 |
| Ex. 115 | 100 | 10 | 0.325 | 10 | 0.175 | 1.8 | 2600 | 600 |
| Ex. 116 | 100 | 10 | 0.325 | 10 | 0.175 | 2.0 | 3000 | 530 |
| Ex. 117 | 100 | 10 | 0.325 | 10 | 0.175 | 3.0 | 2400 | 600 |
| C. Ex. 101 | 10 | 10 | 0.325 | 10 | 0.175 | 2.2 | 2350 | 1000 |
| C. Ex. 102 | 20 | 10 | 0.325 | 10 | 0.175 | 2.2 | 2800 | 800 |
| C. Ex. 103 | 100 | 0 | 0.325 | 10 | 0.175 | 2.2 | 650 | 980 |
| C. Ex. 104 | 100 | 5 | 0.325 | 10 | 0.175 | 2.2 | 1400 | 750 |
| C. Ex. 105 | 100 | 10 | 0 | 10 | 0 | 2.2 | 3300 | 680 |
| C. Ex. 106 | 100 | 10 | 0.325 | 10 | 0.175 | 1.5 | 2300 | 680 |
| C. Ex. 107 | 100 | 10 | 0.325 | 10 | 0.175 | 4.0 | 1800 | 680 |
| C. Ex. 108 | 100 | 10 | 0.325 | 10 | 0.175 | 6.0 | — | — |
| C. Ex. 109 | 0 | 10 | 0.325 | 10 | 0.175 | 2.2 | 600 | 550 |
| C. Ex. 110 Note1 | 0 | 10 | 0.325 | 10 | 0.175 | 2.2 | 2800 | 1200 |

Note1: The polishing composition of Comparative Example 110 further contains 100 g/L of fumed alumina.

As shown in Table 4, polishing compositions of Examples 101 to 117 had increased tungsten polishing rates and reduced erosion amounts. In contrast, polishing compositions of Comparative Examples 101 and 102 each containing a smaller amount of fumed silica, i.e. 20 g/liter or less, had increased erosion amounts. Polishing compositions of Comparative Examples 103 and 104 in which the content of ortho-periodic acid was 5 g/liter or less had reduced tungsten polishing rates and increased erosion amounts. The polishing composition of comparative Example 105 containing no ethylene glycol had an increased erosion amount. Polishing compositions of Comparative Examples 106 and 107 with the pH of less than 1.8 or 4.0 or more had increased erosion amounts. The polishing composition of comparative Example 108 having a high pH of 6.0 was incapable of polishing the blanket wafer and a pattern wafer because they were gelated. The polishing composition of Comparative Example 109 containing no fumed silica had a reduced tungsten polishing rate. The polishing composition of comparative Example 110 containing fumed alumina instead of fumed silica had an increased erosion amount. compositions of Comparative Examples 106 and 107 with the pH of less than 1.8 or 4.0 or more had increased erosion amounts. The polishing composition of Comparative Example 108 having a high pH of 6.0 was incapable of polishing the blanket wafer and the pattern wafer because they were gelated. The polishing composition of Comparative Example 109 containing no fumed silica had a reduced tungsten polishing rate. The polishing composition of Comparative Example 110 containing fumed alumina instead of fumed silica had an increased erosion amount.

The invention claimed is:

1. A polishing composition comprising:
    silicon dioxide;
    at least one component selected from periodic acids and salts thereof;
    at least one component selected from tetraalkyl ammonium hydroxides and tetraalkyl ammonium chlorides;
    hydrochloric acid; and
    water,
    the polishing composition containing substantially no iron.

2. The polishing composition according to claim 1, wherein the mass fraction of hydrochloric acid in the polishing composition is 10 to 1,000 ppm.

3. The polishing composition according to claim 1, wherein the silicon dioxide comprises flamed silica.

4. The polishing composition according to claim 1, wherein the pH of the polishing composition is 2 to 3.

5. A polishing composition comprising:
    fumed silica at a content of greater than 20 g and less than or equal to 200 g per liter of the polishing composition;
    at least one component selected from periodic acids and salts thereof at a content of greater than 5 g and less than or equal to 25 g per liter of the polishing composition;
    a tetraalkyl ammonium salt represented by the following general formula (1):

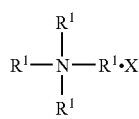

wherein $R^1$ represents a hydrocarbon having 1 to 4 carbon atoms, and X represents a hydroxy group or a halogen atom;
    at least one component selected from ethylene glycol and propylene glycol; and
    water,
    wherein the pH of the polishing composition is greater than or equal to 1.8 and is less than 4.0.

6. The polishing composition according to claim 5, further comprising ammoniun nitrate.

7. The polishing composition according to claim 5, further comprising at least one component selected from benzotriazole and derivatives thereof.

8. The polishing composition according to claim 1, wherein the mass fractions of elements of the second 1:0 twelfth groups of the periodic table, aluminum, gallium, indium, thallium, tin, lead and bismuth are each 100 ppb or less.

9. The polishing composition according to claim 1, wherein the polishing composition is used in forming a viring structure in a semiconductor device.

10. The polishing composition according to claim 9, wherein the polishing composition is used in polishing a conductor layer including a conductor metal, and said conducting layer is formed on an insulator layer having trenches on the surface.

11. The polishing composition according to claim 10, wherein said conductor metal is tungsten.

12. A method for forming a wiring structure comprising:
    forming a metal layer including a conductor layer including a conductor metal on an insulator layer having wenches on the surface; and
    forming wiring portions from said conductor layer in said trenches by polishing said metal layer using a polishing composition so that said insulator layer in areas other than said trenches is exposed, wherein said polishing composition includes silicon dioxide, at least one component selected from periodic acids and salts thereof at least one component selected from tetraalkyl ammonium hydroxides and tetraalkyl ammonium chlorides, hydrochloric acid, and water, and contains substantially no iron.

13. A method for forming a wiring structure comprising:
    forming a metal layer including a conductor layer including a conductor metal on an insulator layer having trenches on the surface;
    polishing said metal layer using a polishing composition to remove most parts of the conductor layer outside said trenches, wherein said polishing composition includes silicon dioxide, at least one component selected from periodic acids and salts thereof, at least one component selected from tetraalkyl ammonium hydroxides and tetraalkyl ammonium chlorides, hydrochloric acid, and water, and contains substantially no iron; and
    forming wiring portions from said conductor layer in said trenches by polishing said metal layer using another polishing composition so that said insulator layer in areas other than said trenches is exposed, wherein said another polishing composition has a rate at which said insulator layer is polished is in the range of 0.67 to 1.5 when the rate at which said conductor layer is polished is 1.

14. A method for forming a wiring structure comprising:
    forming a metal layer including a conductor layer including a conductor metal on an insulator layer having trenches on the surface;
    polishing said metal layer using a polishing composition to remove most parts of the conductor layer outside said trenches, wherein said polishing composition includes silicon dioxide, at least one component selected from periodic acids and salts thereof, at least one component selected from tetraalkyl ammonium hydroxides and tetraalkyl ammonium chlorides, hydrochloric acid, and water, and contains substantially no iron; and
    forming wiring portions from said conductor layer in said trenches by polishing said metal layer using another polishing composition so that said insulator layer in areas other than said trenches is exposed, wherein said another polishing composition includes silicon dioxide, periodic acid, at least one component selected from ammonia, potassium hydroxide, sodium hydroxide, ammonium periodate, potassium periodate and sodium periodate, and water, and contains substantially no iron.

15. A method for form big a wiring structure comprising:
forming a metal layer including a conductor layer including a conductor metal on an insulator layer having trenches on the surface; and
forming wiring portions from said conductor layer in said trenches by polishing said metal layer using a polishing composition so that said insulator layer in areas other than said trenches is exposed, wherein said polishing composition includes fumed silica at a content of greater than 20 g and less than or equal to 200 g per liter of the polishing composition; at least one component selected from periodic acids and salts thereof, at a content of greater than 5 g and less than or equal to 25 g per liter of the polishing composition; a tetraalkyl ammonium salt represented by the following general formula (1):

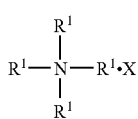

(1)

wherein $R^1$ represents a hydrocarbon having 1 to 4 carbon atoms, and X represents a hydroxy group or a halogen atom; at least one component selected from ethylene glycol and propylene glycol; and water, and the pH of said polishing composition is greater than or equal to 1.8 and is less than 4.0.

16. A method for forming a wiring structure comprising:
forming a metal layer including a conductor layer including a conductor metal on an insulator layer having trenches on the surface;
polishing said metal layer using a polishing composition to remove most parts of the conductor layer outside said trenches, wherein said polishing composition includes fumed silica at a content of greater than 20 g and less than or equal to 200 g per liter of the polishing composition; at least one component selected from periodic acids and salts thereof, at a content of greater than 5 g and less than or equal to 25 g per liter of the polishing composition; a tetraalkyl ammonium salt represent by the following general formula (1):

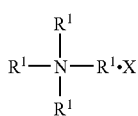

(1)

wherein $R^1$ represents a hydrocarbon having 1 to 4 carbon atoms, and X represents a hydroxy group or a halogen atom; at least one component selected from ethylene glycol and propylene glycol; and water, and the pH of said polishing composition is greater than or equal to 1.8 and is less than 4.0; and forming wiring portions from said conductor layer in said trenches by polishing said metal layer using another polishing composition so that said insulator layer in areas other than said wenches is exposed, wherein said another polishing composition has a rate at which said insulator layer is polished is in the range of 0.67 to 1.5 when the rate at which said conductor layer is polished is 1.

17. A method for forming a wiring structure comprising:
forming a metal layer including a conductor layer including a conductor metal on an insulator layer having trenches on the surface;
polishing said metal layer using a polishing composition to remove most parts of the conductor layer outside said trenches, wherein said polishing composition includes fumed silica at a content of greater than 20 and less than or equal to 200 g per liter of the polishing composition, at least one component selected from periodic acids and salts thereof at a content of greater than 5 g and less than or equal to 25 g per liter of the polishing composition, a tetraalkyl ammonium salt represented by the following general formula (1):

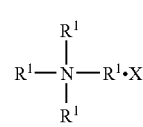

(1)

wherein $R^1$ represents a hydrocarbon having 1 to4 carbon atoms, and X represents a hydroxy group or a halogen atom; at least one component selected from ethylene glycol and propylene glycol; and water, and the pH of said polishing composition is greater than or equal to 1.8 and is less than4.0; and
forming wiring portions from said conductor layer in said trenches by polishing said metal layer using another polishing composition so that said insulator layer in areas other than said trenches is exposed, wherein said another polishing composition includes silicon dioxide, periodic acid, at least one component selected from ammonia, potassium hydroxide, sodium hydroxide, ammonium periodate, potassium periodate and sodium periodate, and water, and contains substantially no iron.

18. The method for forming a wiring structure according to claim 12, wherein said conductor metal is tungsten.

* * * * *

UNITED STATES PATENT AND TRADEMARK OFFICE
CERTIFICATE OF CORRECTION

| | | |
|---|---|---|
| PATENT NO. | : 7,189,684 B2 | Page 1 of 1 |
| APPLICATION NO. | : 10/476717 | |
| DATED | : March 13, 2007 | |
| INVENTOR(S) | : Koji Ohno et al. | |

It is certified that error appears in the above-identified patent and that said Letters Patent is hereby corrected as shown below:

On the face of the Issued Patent at INID Code 87, Publication Data of the International Application Delete: PCT Pub. Date: December 9, 2003

Insert: PCT Pub. Date: September 12, 2003

Signed and Sealed this

Twenty-ninth Day of May, 2007

JON W. DUDAS
*Director of the United States Patent and Trademark Office*